(12) United States Patent
Lagouge

(10) Patent No.: US 9,416,003 B2
(45) Date of Patent: Aug. 16, 2016

(54) SEMICONDUCTOR DIE WITH HIGH PRESSURE CAVITY

(71) Applicant: Matthieu Lagouge, Singapore (SG)

(72) Inventor: Matthieu Lagouge, Singapore (SG)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/188,649

(22) Filed: Feb. 24, 2014

(65) Prior Publication Data

US 2015/0239733 A1    Aug. 27, 2015

(51) Int. Cl.
*B81B 7/02* (2006.01)
*B81C 1/00* (2006.01)
*H01L 21/447* (2006.01)

(52) U.S. Cl.
CPC ..... *B81C 1/00285* (2013.01); *B81B 2201/0235* (2013.01); *B81B 2201/0242* (2013.01); *B81C 2203/0118* (2013.01)

(58) Field of Classification Search
CPC .......................... B81B 7/0032–7/0038; B81C 1/00277–1/00293
See application file for complete search history.

(56) References Cited

U.S. PATENT DOCUMENTS

| | | | |
|---|---|---|---|
| 6,100,108 A * | 8/2000 | Mizuno | B81C 1/00269 438/115 |
| 6,225,145 B1 * | 5/2001 | Choi | B81C 1/00301 257/E21.582 |
| 6,381,062 B1 * | 4/2002 | Kowarz et al. | 359/291 |
| 6,384,959 B1 * | 5/2002 | Furlani et al. | 359/291 |
| 6,635,509 B1 * | 10/2003 | Ouellet | B81C 1/00333 438/106 |
| 6,846,380 B2 * | 1/2005 | Dickinson et al. | 156/345.31 |
| 7,159,459 B2 | 1/2007 | Gogoi | |
| 7,176,111 B2 * | 2/2007 | Baert et al. | 438/479 |
| 7,883,739 B2 * | 2/2011 | Ivanov | C23C 8/02 427/97.1 |
| 7,923,790 B1 * | 4/2011 | Quevy | B81B 7/02 257/414 |
| 8,165,807 B2 * | 4/2012 | Garin | 701/478.5 |
| 8,350,346 B1 | 1/2013 | Huang | |
| 8,546,928 B2 | 10/2013 | Merz | |
| 8,580,596 B2 * | 11/2013 | Magnee | B81C 1/00246 257/415 |
| 8,949,025 B2 * | 2/2015 | Garin | 701/532 |
| 8,972,180 B1 * | 3/2015 | Zhao et al. | 701/468 |
| 2003/0124761 A1 * | 7/2003 | Baert et al. | 438/50 |
| 2003/0155643 A1 * | 8/2003 | Freidhoff | B81C 1/00293 257/704 |

(Continued)

FOREIGN PATENT DOCUMENTS

FR    EP 2571048 A2 *  3/2013  .......... B81C 1/00285

OTHER PUBLICATIONS

"Wafer-Level Packaging of Micromechanical Resonators," Joseph et al., IEEE Transactions on Advanced Packaging, vol. 30, No. 1 Feb. 2007.*

(Continued)

*Primary Examiner* — William F Kraig
*Assistant Examiner* — Maliheh Malek
(74) *Attorney, Agent, or Firm* — Charles E. Bergere

(57) ABSTRACT

A semiconductor die includes a device structure having a micro-electronic device located at a surface of a substrate and a cap coupled to the device structure with the micro-electronic device positioned in a cavity located between the cap and the substrate. A sacrificial material is provided within the cavity, coupling the cap to the device structure. The sacrificial material is heated in the cavity to cause the sacrificial material to decompose to a gaseous species. The presence of the gaseous species in the cavity increases a pressure level in the cavity from an initial pressure to a final pressure.

12 Claims, 3 Drawing Sheets

(56) References Cited

U.S. PATENT DOCUMENTS

| | | | |
|---|---|---|---|
| 2003/0232512 A1* | 12/2003 | Dickinson et al. | 438/786 |
| 2004/0131829 A1* | 7/2004 | Joseph | B32B 3/20 428/166 |
| 2005/0176179 A1* | 8/2005 | Ikushima | H01L 37/02 438/125 |
| 2005/0189635 A1* | 9/2005 | Humpston | B81B 7/0077 257/678 |
| 2007/0273013 A1* | 11/2007 | Kohl | B81C 1/00333 257/682 |
| 2008/0217709 A1* | 9/2008 | Minervini | B81B 7/0061 257/416 |
| 2008/0241604 A1* | 10/2008 | Moore | H01M 4/8605 429/424 |
| 2009/0096669 A1* | 4/2009 | Garin | 342/357.12 |
| 2010/0032775 A1* | 2/2010 | Morris, III | B81C 1/00333 257/415 |
| 2010/0089153 A1 | 4/2010 | Zhang | |
| 2010/0204916 A1* | 8/2010 | Garin | 701/208 |
| 2011/0061884 A1* | 3/2011 | Wang et al. | 174/50.5 |
| 2011/0290552 A1 | 12/2011 | Palmateer | |
| 2012/0056040 A1* | 3/2012 | Brotherton-Ratcliffe et al. | 244/23 A |
| 2012/0161255 A1* | 6/2012 | Gabert | B81C 1/00293 257/415 |
| 2012/0164787 A1 | 6/2012 | Moon | |
| 2012/0228733 A1 | 9/2012 | Garcia-Blanco | |
| 2012/0326248 A1 | 12/2012 | Daneman | |
| 2013/0050166 A1* | 2/2013 | Hong et al. | 345/211 |
| 2013/0270711 A1* | 10/2013 | Hebding | H01L 21/768 257/774 |
| 2013/0341736 A1* | 12/2013 | Kohl | B81C 1/00333 257/415 |
| 2014/0114604 A1* | 4/2014 | Zhang et al. | 702/141 |
| 2014/0166382 A1* | 6/2014 | Zonenberg et al. | 180/128 |
| 2014/0225206 A1* | 8/2014 | Lin et al. | 257/417 |
| 2014/0246708 A1* | 9/2014 | Cheng | B81C 1/00293 257/254 |
| 2015/0001647 A1* | 1/2015 | Dehe et al. | 257/416 |
| 2015/0102437 A1* | 4/2015 | Liu | B81B 3/0021 257/419 |
| 2015/0217992 A1* | 8/2015 | Ebina | B81C 1/00293 257/415 |

OTHER PUBLICATIONS

Unity Sacrificial Materials, Promerus Electronic Materials, 2008.*
"Sacrificial Polymers for Nanofluidic Channels in Biological Applications," Li et al., Princeton University, NJ, Apr. 14, 2003.*
"Air-Gaps for Electrical Interconnections," Kohl et al., Georgia Institue of Technology, May 27, 1998.*
"A Wireless Passive Pressure Microsensor Fabricated in HTCC MEMS Technology for Harsh Environments," Qiulin Tan, Hao Kang, Jijun Xiong, Li Qin, Wendong Zhang, Chen Li, Liqiong Ding, Xiansheng Zhang, and Mingliang Yang, North University of China, Aug. 2, 2013.*
"Monolithic Composite "Pressure + Acceleration + Temperature + Infrared" Sensor Using a Versatile Single-Sided "SiN/Poly-Si/Al" Process-Module," Zao Ni, Chen Yang, Dehui Xu, Hong Zhou, Wei Zhou, Tie Li, Bin Xiong, and Xinxin Li, Shanghai, China, Jan. 16, 2013.*
"Sputtered Encapsulation as Wafer Level Packaging for Isolatable MEMS Devices: A Technique Demonstrated on a Capacitive Accelerometer," Azrul Azlan Hamzah, Jumril Yunas, Burhanuddin Yeop Majlis, and Ibrahim Ahmad, Malaysia, Nov. 19, 2008.*
Merz et al., Combined MEMS Inertial Sensors for IMU Applications, IEEE, 2010, pp. 488-491.

* cited by examiner

SEMICONDUCTOR DIE WITH HIGH PRESSURE CAVITY

BACKGROUND OF THE INVENTION

The present invention relates generally to micro-electronic devices and, more particularly, to increasing a pressure level of a hermetically sealed cavity in a semiconductor die in which a micro-electronic device is located.

Advancements in micro-machining and other micro-fabrication techniques and processes have enabled manufacture of a wide variety of micro-electronic and micro-electromechanical systems (MEMS) devices. One common application of MEMS is the design and manufacture of sensor devices. MEMS sensor devices are widely used in applications such as automotive, inertial guidance systems, household appliances, game devices, protection systems for a variety of devices, and many other industrial, scientific, and engineering systems.

BRIEF DESCRIPTION OF THE DRAWINGS

A more complete understanding of the present invention may be derived by referring to the detailed description and claims when considered in connection with the figures, wherein like reference numbers refer to similar items throughout. The figures are not necessarily drawn to scale, and:

DETAILED DESCRIPTION

Embodiments of the invention entail semiconductor dies containing one or more hermetically sealed cavities in which microelectronic devices are located. Embodiments further entail methodology for adjusting pressure levels in the one or more cavities using sacrificial material. The sacrificial material is decomposed by heat during, for example, a wafer bonding process, to produce a gaseous species and thereby increase the pressure levels in the one or more cavities. Accordingly, semiconductor dies can be fabricated having multiple cavities with differing pressure level requirements.

Various semiconductor dies include a sealed cap that covers the micro-electronic devices and seals them from moisture and foreign materials that could have deleterious effects on device operation. Additionally, some devices have particular pressure requirements in which they most effectively operate. Thus, the cap can include a cavity in which these devices are located, where the cavity has a particular cavity pressure suitable for effective operation of these devices.

Micro-electronic devices, such as some micro-electromechanical systems (MEMS) devices, optoelectronic/photonic devices, integrated circuits, and the like, need to be packaged in a vacuum atmosphere in order to operate correctly. Other types of micro-electronic devices operate in a non-vacuum environment in order to avoid an under damped response in which movable elements of the device can undergo multiple oscillations in response to a single disturbance. By way of example, angular rate sensors, also referred to as gyroscopes, may require a vacuum atmosphere in order to achieve a high quality factor, Q, for low voltage operation and high signal response. Conversely, an accelerometer may require operation in a damped mode in order to reduce shock and vibration sensitivity. Therefore, the two types of sensors may have different pressure requirements for the cavities in which they are located.

Multiple sensors may be integrated into a single device package. In such a multi-sensor device package, a single semiconductor die may contain, for example, both accelerometer and angular rate sensors. A semiconductor die having multiple co-located sensors can reduce both cost and form factor. However, differing cavity pressure requirements have not generally been compatible with prior packaging technologies.

Figure 1:
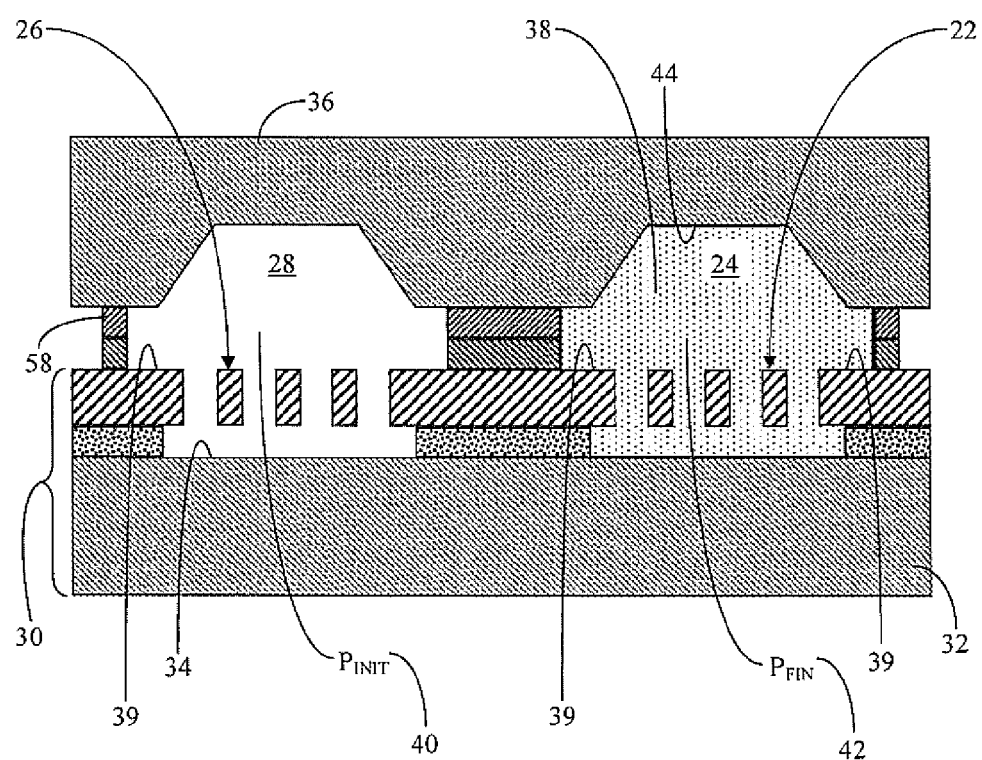
FIG. 1 shows a cross-sectional side view of a semiconductor die in accordance with an embodiment of the present invention.

Referring now to FIG. 1, a cross-sectional side view of a semiconductor die 20 in accordance with an embodiment of the present invention is shown. In one embodiment, the semiconductor die 20 is a microelectromechanical systems (MEMS) die containing at least two MEMS devices housed in hermetically sealed cavities, each having a different cavity pressure requirement. In the illustrated embodiment, the semiconductor die 20 includes a first MEMS device, referred to herein as an accelerometer 22, positioned in a cavity, referred to herein as an accelerometer cavity 24. Additionally, the semiconductor die 20 includes a second MEMS device, referred to herein as an angular rate sensor 26, positioned in another cavity, referred to herein as a rate sensor cavity 28.

In some embodiments, the design of the angular rate sensor 26 calls for low pressure operation, e.g., at approximately vacuum, to achieve a high quality factor, Q. Conversely, the design of the accelerometer 22 calls for a pressure level closer to atmospheric pressure, i.e., greater than vacuum, in order to avoid an under damped response. Structure and methodology described herein yield a configuration in which the pressure level in the rate sensor cavity 28 differs from the pressure level in the accelerometer cavity 24.

For clarity and ease of description, only a single angular rate sensor 26 and a single accelerometer 22 are shown. However, it should be understood that alternative embodiments can include different micro-electronic devices having different cavity pressure requirements that are co-located on a single substrate. These micro-electronic devices may be in the form of integrated circuits, optoelectronic/photonic devices, and a variety of MEMS devices, such as magnetic sensors, gas sensors, actuators, switches, and so forth having one or more movable elements or masses. And in one embodiment, there is just a single cavity that requires an internal pressure that is different from atmospheric pressure outside of the cavity. Additionally, or alternatively, either of the cavities 24 and 28 may have more than one micro-electronic device located therein, each having similar pressure level requirements.

The semiconductor die 20 includes a device structure 30 that includes a silicon-based substrate 32 having a surface 34 at which the angular rate sensor 26 and accelerometer 22 are located. A cap 36 is coupled to a surface, referred to therein as a device surface 39 of the device structure 30. The cap 36 has the accelerometer and rate sensor cavities 24 and 28, respectively, formed therein. In one embodiment, the cap 36 is bonded or otherwise coupled to the device structure 30 such that each of the cavities 24 and 28 is hermetically sealed and isolated one from the other. That is, each of the accelerometer and rate sensor cavities 24 and 28 is suitably sealed to largely prevent entry of water vapor and/or foreign bodies so as to maintain the proper functioning and reliability of the accelerometer 22 and angular rate sensor 26.

Although the cap 36 is shown having the cavities 24 and 28 formed therein, it should be understood that the cavities 24 and 28 are located between the cap 36 and the substrate 32. As such, in alternative embodiments the cavities 24 and 28 may be formed in the substrate 32 in lieu of being formed in the cap 36. In still other embodiments, the cavities 24 and 28 may not be formed in the material structure of either of the cap 36 or the substrate 32. Instead, the cavities 24 and 28, in the form of spaces above and below the movable parts of the accelerometer 22 and 26, may be created from the bond material thickness and/or by pillars or other structures interposed between and separating the cap 36 and the substrate 32.

It will be appreciated that the accelerometer 22 and angular rate sensor 26 can include one or more movable elements suspended above the substrate 32 by, for example, suspension springs (not shown). Additionally, the accelerometer 22 and angular rate sensor 26 may additionally include one or more non-illustrated fixed and moving electrodes. Indeed, the specific structure and configuration of the accelerometer 22 and angular rate sensor 26 may vary. However, a description of the specific structure and configuration of the accelerometer 22 and angular rate sensor 26 is not needed to enable or fully describe the present embodiment, and are thus not described in further detail.

In the embodiment of FIG. 1, a gaseous species 38, illustrated using a stippled pattern, of a sacrificial material is located within the accelerometer cavity 24, but the gaseous species 38 is absent from the rate sensor cavity 28. As will be discussed in greater detail below, a sacrificial material may be provided within the accelerometer cavity 24 during fabrication of the semiconductor die 20. The sacrificial material within the accelerometer cavity 24 is heated to cause the sacrificial material to decompose to the gaseous species 38. The presence of the gaseous species 38 in the accelerometer cavity 24, produced from the decomposition of the sacrificial material, effectively results in an increase in the pressure within the accelerometer cavity 24 from a first pressure level, e.g., a vacuum atmosphere, to a second pressure level, e.g., a non-vacuum atmosphere at or close to standard atmospheric pressure. For illustrative purposes, a pressure level 40 (labeled $P_{INIT}$) of the rate sensor cavity 28 may be at or near vacuum, and a pressure level 42 (labeled $P_{FIN}$) of the accelerometer cavity 24 is greater than pressure level 40. For example, the pressure level 42 may be at or near atmospheric pressure.

Embodiments described herein entail the express formation of the gaseous species 38 by the provision of a sacrificial material on an inner surface 44 of the cap 36 within the accelerometer cavity 24. It should be appreciated, however, that the sacrificial material may be accessible to the cavity 24 by, for example, being deposited or otherwise located on the surface 34 of the substrate 32 within the cavity 24. When heated, the sacrificial material decomposes to provide the gaseous species 38 for the purpose of increasing a pressure level within the accelerometer cavity 24. As discussed below in connection with a method for fabricating the semiconductor die 20, a suitable volume of the sacrificial material is deposited on the inner surface 44 of the cap 36. The sacrificial material is decomposed to the gaseous species 38 during a wafer bonding process and/or during a post-bonding annealing process in order to increase the pressure level within the accelerometer cavity 24.

The sacrificial material is chosen depending upon the type of bonding implemented and an available thermal budget. Exemplary bonding techniques can include eutectic bonding, thermocompression bonding, fusion bonding, and so forth. Thermal budget refers to the maximum temperature, typically combined with a duration, that can be afforded during a bonding process. The thermal budget may be constrained depending upon the material to be bonded. For example, CMOS wafers can withstand a thermal budget of 300-450° C. depending upon particular technologies, duration of the process, and so forth. Beyond that limit, the circuitry may begin to degrade.

In one embodiment, the sacrificial material may be a thermoplastic polymer that may be used in conjunction with, for example, eutectic or thermocompression bonding. An exemplary thermoplastic polymer is Unity® sacrificial polymer produced by Promerus™ Electronic Materials, Brecksville, Ohio, USA. However, other sacrificial materials that can be provided via a deposition process and that are capable of decomposition into a gaseous species at a given temperature may alternatively be utilized. For example, a sacrificial material that decomposes into a gaseous species at high temperature (e.g., 1100° C. or higher) may be used in conjunction with fusion bonding and/or high temperature annealing.

Figure 2:
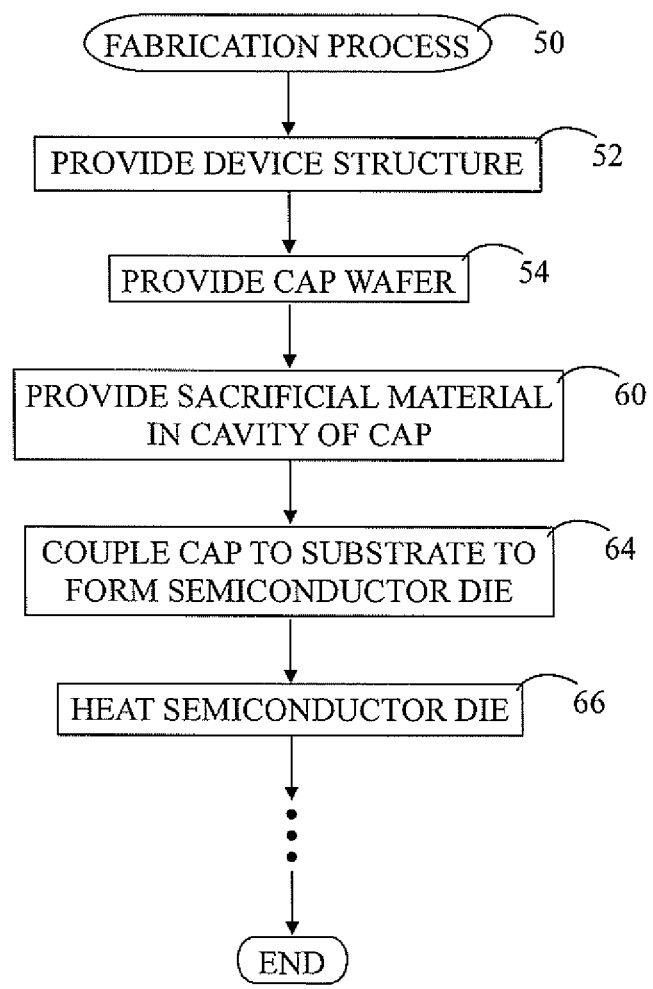
FIG. 2 is a flow chart of a process for fabricating the semiconductor die of FIG. 1 in accordance with an embodiment of the present invention.

FIG. 2 is a flow chart of a fabrication process 50 for fabricating a semiconductor die in accordance with another embodiment of the present invention. The fabrication process 50 is performed to produce semiconductor dies having microelectronic devices housed within cavities designed to operate most effectively at certain predetermined cavity pressures. For convenience, the fabrication process 50 is described using a particular order of operations. However, portions of the fabrication process 50 may be performed in a different order or using different types of operations than what is described below.

For clarity and ease of explanation, the operations of the fabrication process 50 are described in connection with the fabrication of the semiconductor die 20 (FIG. 1). As such reference should be made to FIG. 1 in connection with the operations of the fabrication process 50. However, it should be appreciated that the fabrication process 50 may be readily implemented to fabricate any other semiconductor die having one or more hermetically sealed cavities for which a particular cavity pressure is desired. Additionally, the fabrication process 50 is described in connection with the fabrication of a single semiconductor die 20. However, in practice, the fabrication process 50 may be implemented during wafer level processing to concurrently fabricate a multiplicity of the semiconductor dies 20.

The fabrication process 50 may begin with an operation 52, which entails providing the micro-electronic devices. More particularly, the device structure 30 is provided having the accelerometer 22 and angular rate sensor 26 formed on the substrate 32. The process steps used to form the accelerometer 22 and angular rate sensor 26 are not described herein, as the device structure 30 having the accelerometer 22 and angular rate sensor 26 can be formed using any of a number of known or upcoming fabrication processes.

Figure 3:
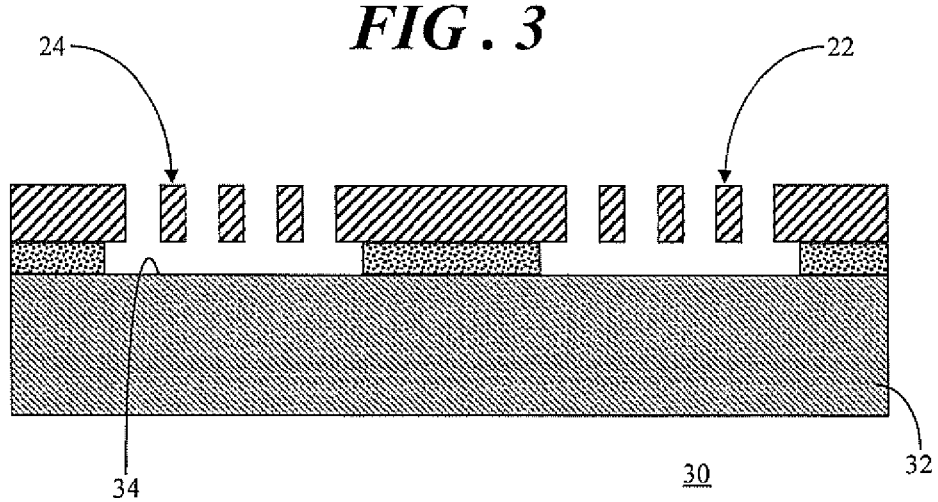
FIG. 3 shows a cross-sectional side view of a substrate structure of the semiconductor die of FIG. 1.

Referring to FIG. 3 in connection with the operation 52, FIG. 3 shows a cross-sectional side view of the device structure 30 of the semiconductor die 20 (FIG. 1). In particular, FIG. 3 shows a portion of a MEMS wafer at which the accelerometer 22 and angular rate sensor 26 are formed on the surface 34 of the substrate 32.

Referring back to the fabrication process 50 (FIG. 2), an operation 54 is performed in addition to the operation 52. The operation 54 entails providing the cap 36. The cap 36 may be formed from, for example, crystalline silicon, and is manufactured to include the accelerometer cavity 24 and rate sensor cavity 28. The process steps used to form the cap 36 are not described herein, as the cap 36 can be formed using any of a number of known or upcoming fabrication techniques. Again, it should be understood that in some embodiments, the cap may not have separately formed cavities 24 and 28. Instead, the accelerometer 22 and angular rate sensor 26 may be formed in cavities within the device die, i.e., within the substrate 32. And in still other embodiments, the cavities 24 and 28 may be created from the bond material thickness and/or by pillars or others structures interposed between and separating the cap 36 and the substrate 32 when they are bonded together during subsequent operations.

Figure 4:
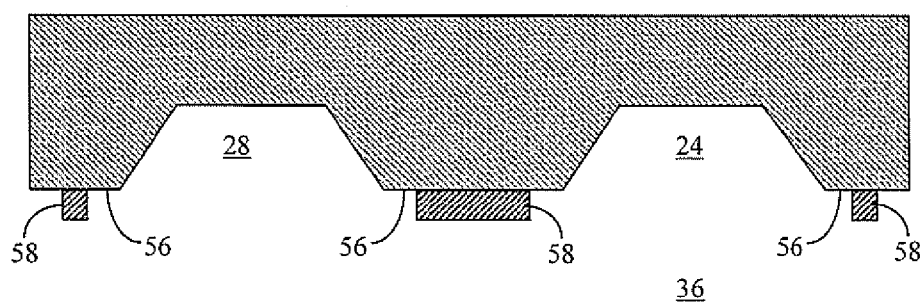
FIG. 4 shows a cross-sectional side view of a cap for the semiconductor die of FIG. 1.

Referring to FIG. 4 in connection with the operation 54, FIG. 4 shows a cross-sectional side view of the cap 36 for the semiconductor die 20. The cap 36 may be formed in a series of operations that include metal deposition on a surface 56 of the cap 36, lithography to form a seal ring and contacts 58 on the surface 56, and lithography and etch processes to form the cavities 24 and 28 in accordance with known and upcoming methodologies.

Referring back to the fabrication process 50 (FIG. 2), an operation 60 is performed in connection with the operation 54. In an embodiment, a sacrificial material is provided in the accelerometer cavity 24 of the cap 36. However, no sacrificial material may be provided in the angular rate sensor cavity 28.

Figure 5:
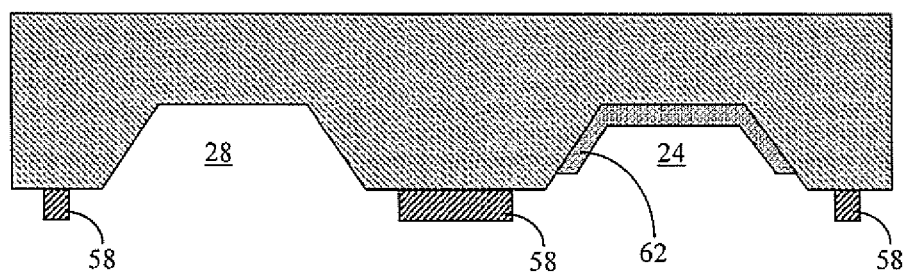
FIG. 5 shows a cross-sectional side view of the cap of FIG. 4 provided with a sacrificial material within a cavity of the cap.

With reference to FIG. 5 in connection with the operation 52, FIG. 5 shows a cross-sectional side view of the cap 36 provided with a sacrificial material 62 within the accelerometer cavity 24. The sacrificial material 62 may be provided using a lithography process. In alternative embodiments, the sacrificial material 62 may be provided using shadow mask deposition, deposition/lithography/etch processes, or any suitable process. Alternatively, the sacrificial material 62 may be provided on the surface 34 of the substrate 32 within the accelerometer cavity 24.

The volume of sacrificial material 62 provided within the accelerometer cavity 24 depends at least in part upon the volume of the accelerometer cavity 24, the target pressure level for the accelerometer cavity 24, the composition of the sacrificial material 62, the density of the sacrificial material 62 after development, the gaseous species produced in response to decomposition of the sacrificial material 62, and so forth. In general, the sacrificial material 62 should be thick enough to produce a sufficient volume of the gaseous species 38 for release into the accelerometer cavity 24 upon decomposition of the sacrificial material 62 in response to application of heat. Both extent and thickness of the sacrificial material 62 can be determined according to the total amount of the gaseous species 38 that is to fill the accelerometer cavity 24 to effectively increase the pressure level within the accelerometer cavity 24.

In some embodiments, the operation 60 is performed to provide the sacrificial material 62 in the accelerometer cavity 24 while abstaining from providing any of the sacrificial material 62 in the rate sensor cavity 28. In other embodiments, it may be useful to provide the sacrificial material 62 in both of the cavities 24, 28 in order to increase the pressure levels in the cavities 24, 28. For example, different volumes of sacrificial material 62 may be provided in each cavity 24, 28 to increase the pressure level in each cavity 24, 28. But, the differing volumes of sacrificial material 62 can result in different pressure levels in each cavity 24, 28 in accordance with a particular design configuration for the semiconductor die 20.

Returning to the fabrication process 50 (FIG. 2), following the provision of the sacrificial material 62 in the accelerometer cavity 24 at the operation 60, an operation 64 is performed. At operation 64, the cap 36 (FIG. 5) is coupled to the device structure 30 (FIG. 3) to form the semiconductor die 20. An operation 66 is performed in conjunction with operation 64. At operation 66, the semiconductor die 20 is heated.

The coupling of the cap 36 to the device structure 30 may occur in a vacuum environment so that an initial pressure level preceding the heating operation 66 in each of the accelerometer and rate sensor cavities 24 and 28 is the same, i.e., pressure level 40 at or near vacuum (significantly below one atmosphere). The semiconductor die 20 is typically subjected to heat during bonding of the cap 36 to the device structure 30. By way of example, eutectic wafer level bonding and/or thermocompression bonding can impose a peak temperature of approximately four hundred degrees Celsius. As mentioned previously, an exemplary sacrificial material 62 may be Promerus™ Unity® sacrificial polymer. Unity® sacrificial material 62 within the cavity 24 is capable of one hundred percent decomposition between three hundred and four hundred degrees Celsius into the organic gaseous species 38 (FIG. 1).

In some embodiments, the heat applied during bonding may not be sufficient to entirely decompose the sacrificial material 62 into the gaseous species 38. Therefore, the heating operation 66 may additionally or alternatively entail a post-bond annealing process. Annealing is a heat treatment that may be performed to increase the strength of the bond between the device structure 30 and the cap 36. In addition to strengthening the bond between the device structure 30 and the cap 36, post-bond annealing may heat the sacrificial material 62 to a temperature sufficient to decompose the sacrificial material 62 into the gaseous species 38. Accordingly, the heating operation 66 conducted in conjunction with the coupling operation 64 and/or post-bond annealing can be performed at a temperature sufficient to entirely decompose the sacrificial material 62 to provide the gaseous species 38, and thereby increase the pressure in the accelerometer cavity 24 from the initial pressure 40, such as at or near vacuum to a final pressure, i.e., pressure level 42 (see FIG. 1), such as at or near atmospheric pressure.

Following the operation 66, the fabrication process 50 may continue with additional processing operations, such as wafer level testing, packaging, burn-in, dicing, and so forth as known to those skilled in the art. Eventually, the fabrication process 50 ends following the fabrication of semiconductor dies having microelectronic devices housed within cavities designed to operate most effectively at certain predetermined cavity pressures.

In summary, embodiments of the invention entail semiconductor dies having caps bonded thereto, where the caps have one or more cavities formed therein. At least one microelectronic device is positioned in each cavity. Methodology entails adjusting pressure levels in the one or more cavities using a sacrificial material. In particular, a sacrificial material is provided in at least one cavity in each semiconductor die. The sacrificial material is configured to decompose into a gaseous species when heated and thereby increase the pressure in the hermetically sealed cavity. As such, semiconductor dies can be efficiently and cost effectively fabricated having multiple cavities with differing pressure level requirements.

Although the preferred embodiments of the invention have been illustrated and described in detail, it will be readily apparent to those skilled in the art that various modifications may be made therein without departing from the spirit of the invention or from the scope of the appended claims. That is, it should be appreciated that the exemplary embodiments are only examples, and are not intended to limit the scope, applicability, or configuration of the invention.

For example, the sacrificial material described herein can be any sacrificial material that decomposes to produce a gaseous species sufficient to increase the pressure within a hermetically sealed cavity. Additionally, heating of the sacrificial material may occur in conjunction with bonding or separate from bonding using any suitable technique.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the above described operations are merely illustrative. Multiple operations may be combined into a single operation, a single operation may be distributed in additional operations, and operations may be executed at least partially overlapping in time. Moreover, alternative embodiments may include multiple instances of a particular operation, and the order of operations may be altered in various other embodiments. Other modifications, variations and alternatives are also possible. The specifications and drawings are, accordingly, to be regarded in an illustrative rather than in a restrictive sense.

In the claims, any reference signs placed between parentheses shall not be construed as limiting the claim. The word "comprising" does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A method of fabricating a semiconductor die that includes a device structure and a cap defining a hermetically sealed cavity, the device structure having a micro-electronic device located at a surface of a substrate, the method comprising:
    providing a sacrificial material within the cavity, wherein the sacrificial material comprises a thermoplastic polymer;
    coupling the cap to the device structure with the micro-electronic device positioned in the cavity; and
    heating the sacrificial material in the cavity to cause the sacrificial material to decompose to a gaseous species to increase a pressure in the cavity from a first pressure level to a second pressure level,
    wherein heating the sacrificial material is performed at a temperature sufficient to entirely decompose the sacrificial material to the gaseous species.

2. The method of claim 1, wherein coupling the cap to the device structure and heating the sacrificial material are performed concurrently.

3. The method of claim 1, wherein coupling the cap to the device structure and heating the sacrificial material are performed using eutectic bonding.

4. The method of claim 1, wherein coupling the cap to the device structure and heating the sacrificial material are performed using thermocompression bonding.

5. The method of claim 1, wherein heating the sacrificial material is performed after coupling the cap to the device structure.

6. The method of claim 1, wherein heating the sacrificial material comprises performing an annealing process after coupling the cap to the device structure, wherein the annealing process heats the sacrificial material.

7. The method of claim 1, wherein the micro-electronic device is a first micro-electronic device, the cavity is a first cavity, a second micro-electronic device is located at the surface of the substrate, the second micro-electronic device being laterally displaced from the first micro-electronic device, the cap and the surface define a second cavity, the method further comprising:
    abstaining from providing the sacrificial material in the second cavity;
    the coupling couples the cap to the device structure with the second micro-electronic device positioned in the second cavity, the pressure in each of the first and second cavities being at the first pressure level preceding the heating operation; and
    the heating the sacrificial material decomposes the sacrificial material in the first cavity to increase the pressure in the first cavity to the second pressure level without changing the pressure in the second cavity from the first pressure level.

8. The method of claim 7, wherein coupling the cap to the device structure is performed in a vacuum environment such that the first pressure level in each of the first and second cavities before the heating operations is less than standard atmospheric pressure.

9. A semiconductor die, comprising:
    a device structure having a microelectronic device located at a surface of a substrate;
    a cap coupled to the device structure with the microelectronic device positioned in a hermetically sealed cavity located between the cap and the substrate; and
    a gaseous species of a sacrificial material located within the cavity, wherein the sacrificial material is entirely decomposed to produce the gaseous species and thereby increase a pressure in the cavity from a first pressure level to a second pressure level, and wherein the sacrificial material comprised a thermoplastic polymer.

10. The semiconductor die of claim 9, wherein the sacrificial material is provided within the cavity prior to the cap being coupled to the device structure, and the sacrificial material is heated when the cap is coupled to the device structure to cause the sacrificial material to entirely decompose to the gaseous species.

11. The semiconductor die of claim 9, wherein the microelectronic device is a first microelectronic device, the cavity is a first cavity, the device structure further comprises a second microelectronic device located at the surface of the substrate and laterally displaced away from the first microelectronic device, the second microelectronic device being positioned in a second cavity defined by the cap and the substrate, wherein the gaseous species of the sacrificial material is absent from the second cavity and the pressure in the second cavity is at the first pressure level.

12. The semiconductor die of claim 11, wherein the first pressure level is less than standard atmospheric pressure, and the second pressure level is greater than the standard atmospheric pressure.

* * * * *